(12) United States Patent
Kang

(10) Patent No.: US 9,396,797 B2
(45) Date of Patent: Jul. 19, 2016

(54) PROGRAM METHODS OF MEMORY DEVICES USING BIT LINE SHARING

(71) Applicant: Samsung Electronics Co., Ltd., Suwon-si, Gyeonggi-do (KR)

(72) Inventor: Dongku Kang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 14/151,534

(22) Filed: Jan. 9, 2014

(65) Prior Publication Data

US 2014/0219025 A1 Aug. 7, 2014

(30) Foreign Application Priority Data

Feb. 5, 2013 (KR) .......................... 10-2013-0013033

(51) Int. Cl.
  *G11C 11/34* (2006.01)
  *G11C 16/10* (2006.01)
  *G11C 16/34* (2006.01)
  *G11C 16/24* (2006.01)

(52) U.S. Cl.
  CPC ................ *G11C 16/10* (2013.01); *G11C 16/24* (2013.01); *G11C 16/3459* (2013.01)

(58) Field of Classification Search
  USPC .................................................... 365/185.11
  See application file for complete search history.

(56) References Cited

U.S. PATENT DOCUMENTS

| | | | |
|---|---|---|---|
| 7,313,023 B2 | 12/2007 | Li et al. | |
| 7,616,491 B2 | 11/2009 | Kamigaichi et al. | |
| 7,623,383 B2 * | 11/2009 | Park | G11C 11/5628 365/185.12 |
| 7,706,184 B2 | 4/2010 | Hamada | |
| 7,889,555 B2 * | 2/2011 | Lee | G11C 16/0483 365/185.12 |
| 8,208,301 B2 | 6/2012 | Kang et al. | |
| 8,331,126 B2 | 12/2012 | Terzioglu | |
| 8,503,248 B2 * | 8/2013 | Otsuka | G11C 16/0483 365/185.11 |
| 2007/0115724 A1 * | 5/2007 | Hwang | G11C 16/0483 365/185.17 |
| 2007/0183204 A1 | 8/2007 | Kim et al. | |
| 2011/0128788 A1 * | 6/2011 | Honda | G11C 16/0408 365/185.11 |
| 2012/0147676 A1 | 6/2012 | Mokhlesi et al. | |

FOREIGN PATENT DOCUMENTS

| | | |
|---|---|---|
| JP | 2006-155750 A | 6/2006 |
| JP | 2011-113619 A | 6/2011 |
| KR | 10-0742278 | 7/2007 |
| KR | 10-0948483 B1 | 3/2010 |

* cited by examiner

*Primary Examiner* — Hoai V Ho
*Assistant Examiner* — Pablo Huerta
(74) *Attorney, Agent, or Firm* — Myers Bigel & Sibley, P.A.

(57) ABSTRACT

A program method of a nonvolatile memory device includes loading first word line data to be stored in first memory cells connected to a first word line and second word line data to be stored in second memory cells connected to a second word line; setting up upper bit lines according to the first word line data; turning off bit line sharing transistors after the upper bit lines are set up; setting up lower bit lines according to the second word line data; performing a first program operation on the first memory cells using the upper bit lines; turning on the bit line sharing transistors; and performing a second program operation on the second memory cells using the lower bit lines. The bit line sharing transistors electrically connect the upper bit lines and the lower bit lines in response to a bit line sharing signal.

13 Claims, 9 Drawing Sheets

PROGRAM METHODS OF MEMORY DEVICES USING BIT LINE SHARING

CROSS-REFERENCE TO RELATED APPLICATION

This U.S. non-provisional application claims priority under 35 U.S.C. §119 to Korean Patent Application No. 10-2013-0013033 filed Feb. 5, 2013, the entirety of which is hereby incorporated herein by reference.

BACKGROUND

The inventive concepts described herein relate to program and read methods of memory devices.

Semiconductor memory devices may be volatile or nonvolatile. A nonvolatile semiconductor memory device may retain data stored therein even at power-off. The nonvolatile memory device may be permanent or reprogrammable, depending upon the fabrication technology used. The nonvolatile memory device may be used for user data, program, and microcode storage in a wide variety of applications in the computer, avionics, telecommunications, and consumer electronics industries.

SUMMARY

One aspect of embodiments of the inventive concepts is directed to provide a program method of a nonvolatile memory device comprising loading first word line data to be stored in first memory cells connected to a first word line and second word line data to be stored in second memory cells connected to a second word line; setting up upper bit lines according to the first word line data; turning off bit line sharing transistors after the upper bit lines are set up; setting up lower bit lines according to the second word line data; performing a first program operation on the first memory cells using voltages of the upper bit lines; turning on the bit line sharing transistors; and performing a second program operation on the second memory cells using voltages of the lower bit lines, wherein the bit line sharing transistors electrically connect the upper bit lines and the lower bit lines in response to a bit line sharing signal.

In example embodiments, the performing a first program operation on the first memory cells using voltages of the upper bit lines comprises applying a program pulse to the first word line.

In example embodiments, the performing a second program operation on the second memory cells using voltages of the lower bit lines comprises applying the program pulse to the second word line.

In example embodiments, the program pulse is simultaneously applied to the first and second word lines in the first and second program operations.

In example embodiments, a pass voltage is applied to the remaining word lines other than the first and second word lines in the first and second program operations.

In example embodiments, the first and second program operations are executed at the same time.

In example embodiments, a first memory block including the first memory cells is separated from a second memory block including the second memory cells.

In example embodiments, the program method further comprises performing a program verification operation after the first and second program operations are executed.

In example embodiments, the program method further comprises increasing a program pulse by a predetermined value when the program verification operation is failed; setting up the upper and lower bit lines; and performing the first and second program operations.

In example embodiments, the bit line sharing transistors are high voltage transistors.

Another aspect of embodiments of the inventive concepts is directed to provide a read method of a nonvolatile memory device, comprising pre-charging upper bit lines and lower bit lines by turning on bit line sharing transistors; turning off the bit line sharing transistors after pre-charging the upper bit lines and the lower bit lines; applying a read voltage to first and second word lines selected according to an address; performing a first sensing operation to sense data of first memory cells connected with first word lines through upper sense latches connected with the upper word lines; turning off the bit line sharing transistors; performing a second sensing operation to sense data of second memory cells connected with second word lines through lower sense latches connected with the lower word lines; transferring data stored at the upper sense latches and data stored at the lower sense latches to data latches; and outputting data stored at the data latches to an external device, wherein the bit line sharing transistors electrically connect the upper bit lines and the lower bit lines in response to a bit line sharing signal.

In example embodiments, a read pass voltage is applied to the remaining word lines other than the first and second word lines in the first and second sensing operations.

In example embodiments, the nonvolatile memory device comprises a memory cell array having the first and second memory cells. The upper sense latches are disposed at a top of the memory cell array and the data latches and the lower sense latches are disposed at a bottom of the memory cell array.

In example embodiments, the upper bit lines are discharged after the first sensing operation.

In example embodiments, each of the upper bit lines is connected to a string including at least one string selection transistor, a plurality of memory cells, and at least one ground selection transistor being connected in series.

Another aspect of embodiments of the inventive concepts is directed to provide a program method of a memory device that comprises coupling respective bit lines of first and second portions of the memory device together, applying first data to be programmed into the first portion of the memory device to the respective bit lines of the first and second portions of the memory device that are coupled together, decoupling the respective bit lines of first and second portions of the memory device from one another, and applying second data to be programmed into the second portion of the memory device to the respective bit lines of the second portion of the memory device that are decoupled from the bit lines of the first portion.

In example embodiments, the following is performed between the decoupling and the applying second data: discharging the bit lines of the second portion of the memory device that are decoupled from the bit lines of the first portion.

Example embodiments further comprise simultaneously selecting a word line of the first portion of the memory device and a word line of the second portion of the memory device so as to simultaneously program the first data into the first portion of the memory device and the second data into the second portion of the memory device.

In example embodiments, the coupling and the decoupling are performed by turning on and turning off, respectively, a plurality of bit line sharing transistors, a respective one of which electrically connects a respective one of the bit lines of the first and second portions of the memory device.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
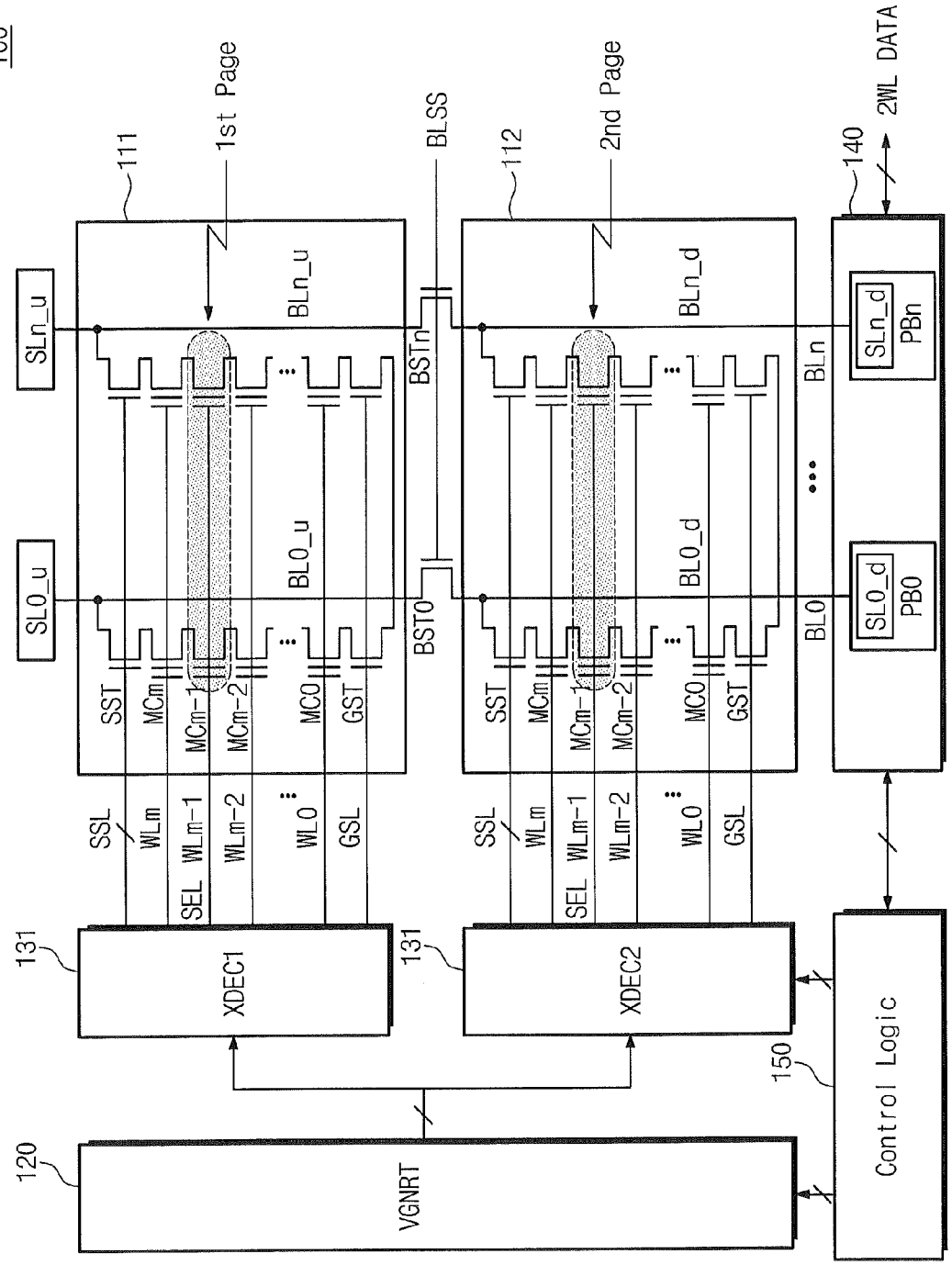
FIG. 1 is a block diagram schematically illustrating a nonvolatile memory device according to an embodiment of the inventive concepts.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that when an element or layer is referred to as being "connected to" or "coupled to" another element or layer, it can be directly connected or coupled to the other element or intervening elements may be present. In contrast, when an element is referred to as being "directly connected to" or "directly coupled to" another element or layer, there are no intervening elements present. As used herein, the term "and/or" includes any and all combinations of one or more of the associated listed items.

The present invention is described in part below with reference to block diagrams of methods, systems and computer program products according to various embodiments. It will be understood that a block of the block diagrams, and combinations of blocks in the block diagrams may be implemented at least in part by computer program instructions. Accordingly, a given block or blocks of the block diagrams provides support for methods, computer program products and/or systems (structural and/or means-plus-function). Finally, the functionality of one or more blocks may be separated and/or combined with that of other blocks.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device 100 according to an embodiment of the inventive concepts. Referring to FIG. 1, a nonvolatile memory device 100 may include a memory cell array having first and second memory blocks 111 and 112, first and second address decoders 131 and 132 a voltage generating circuit 120, an input/output circuit 140, and control logic 150.

The nonvolatile memory device 100 may be a NAND flash memory device, for example. However, it is well understood that the nonvolatile memory device 100 is not limited to the NAND flash memory device. For example, the inventive concepts may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device can be implemented to have a three-dimensional array structure. In this case, the nonvolatile memory device may be referred to as a vertical NAND flash memory device. The inventive concepts may be applied to a Charge Trap Flash (CTF) memory device including a charge storage layer formed of an insulation film as well as a flash memory device including a charge storage layer formed of a conductive floating gate. Below, the inventive concepts will be described under the condition that the nonvolatile memory device 100 is a NAND flash memory device.

The memory cell array may include a plurality of memory blocks. In FIG. 1, there is illustrated two memory blocks 111 and 112. Each of the memory blocks 111 and 112 may include strings respectively connected to bit lines BL0 to BLn (n being an integer of 2 or more). Here, each bit line BLi (i being 0 through n) may be formed of an upper bit line BLi_u, a lower bit line BLi_d, and a bit line sharing transistor BSTi connecting the upper bit line BLi_u and the lower bit line BLi_d in response to a bit line sharing signal BLSS.

In example embodiments, the upper bit lines BL0_u to BLn_u may be connected to the first memory block 111, and the lower bit lines BL0_d to BLn_d may be connected to the second memory block 112. Although not shown in FIG. 1, the upper bit lines BL0_u to BLn_u may be connected to a plurality of memory blocks, and the lower bit lines BL0_d to BLn_d may be connected to a plurality of memory blocks.

In example embodiments, gates of the bit line sharing transistor BST0 to BSTn may be connected to receive the bit line sharing signal BLSS.

In example embodiments, the bit line sharing transistor BST0 to BSTn may be high voltage transistors.

Here, a string may include at least one string selection transistor SST, memory cells MC0 to MCm (m being an integer of 2 or more), and at least one ground selection transistor GST. The string selection transistor SST may be driven by a voltage transferred through a string selection line SSL, and the ground selection transistor GST may be driven by a voltage transferred through a ground selection line GSL. Each of the memory cells may store at least one bit of data, and may be driven by a voltage transferred through a corresponding one of word lines WL0 to WLm.

The voltage generating circuit 120 may generate driving voltages (e.g., Vpp, Vers, Vpgm, Vpass, Vr, Vread, etc.)

needed to drive the nonvolatile memory device 100. The voltage generating circuit 120 may generate the driving voltages using at least one charge pump (not shown) or by dividing an external high voltage.

Each of the first and second address decoders 131 and 132 may select one of a plurality of memory blocks in response to an address to transfer word line voltages (e.g., a program voltage Vpgm, a pass voltage Vpass, an erase voltage Vers, a verification voltage Vvfy, a read voltage Vr, a read pass voltage Vread, etc.) for driving to corresponding word lines. Also, each of the first and second address decoders 131 and 132 may select a word line based on an address received at a program or read operation. Although not shown in FIG. 1, address decoders may correspond to memory blocks, respectively.

At a program operation, the input/output circuit 140 may temporarily store two word line data 2WL DATA received from an external device to store it at pages $1^{st}$ page and $2^{nd}$ page to be written. At a read operation, the input/output circuit 140 may temporarily read two word line data from pages $1^{st}$ page and $2^{nd}$ page to be read to output it to the external device. Here, each of the pages $1^{st}$ page and $2^{nd}$ page may mean memory cells connected with a word line (e.g., WLm-1).

The input/output circuit 140 may include page buffers PB0 to BPn respectively corresponding to the bit lines BL0 to BLn. Each of the page buffers PB0 to BPn may include a plurality of data latches (not shown), upper sense latches SL0_u to SLn_u, and lower sense latches SL0_d to SLn_d.

In example embodiments, the data latches may store two word line data input or output at a program or read operation.

In example embodiments, the upper sense latches SL0_u to SLn_u may be disposed at a top of the memory cell array to be connected to the upper bit lines BL0_u to BLn_u.

In example embodiments, the lower sense latches SL0_d to SLn_d may be disposed at a bottom of the memory cell array to be connected to the lower bit lines BL0_d to BLn_d.

The control logic 150 may control an overall operation of the nonvolatile memory device 100. The control logic 150 may decode commands and control signals to control the voltage generating circuit 120, the address decoders 131 and 132, and the input/output circuit 140.

In example embodiments, the control logic 150 may control the voltage generating circuit 120, the address decoders 131 and 132, and the input/output circuit 140 to simultaneously write or read two word line data at or from first and second pages connected with two word lines (e.g., WL1 and WLm-1) at a program or read operation.

In example embodiments, the control logic 150 may generate the bit line sharing signal BLSS to simultaneously write or read two word line data at or from first and second pages.

The nonvolatile memory device 100 according to an embodiment of the inventive concepts may simultaneously write or read two word line data at or from first and second pages by dividing the bit lines BL0 to BLn. As compared to a conventional nonvolatile memory device, the performance of program and read operations of the nonvolatile memory device 100 of the inventive concepts may be improved.

Also, the nonvolatile memory device 100 according to an embodiment of the inventive concepts may reduce overhead of a chip size on a program/read operation of two word line data by disposing the upper sense latches SL0_u to SLn_u associated with a data sensing operation at a top of the memory cell array and the remaining components of the page buffers PB0 to PBn other than the upper sense latches SL0_u to SLn_u at a bottom of the memory cell array.

Figure 2:
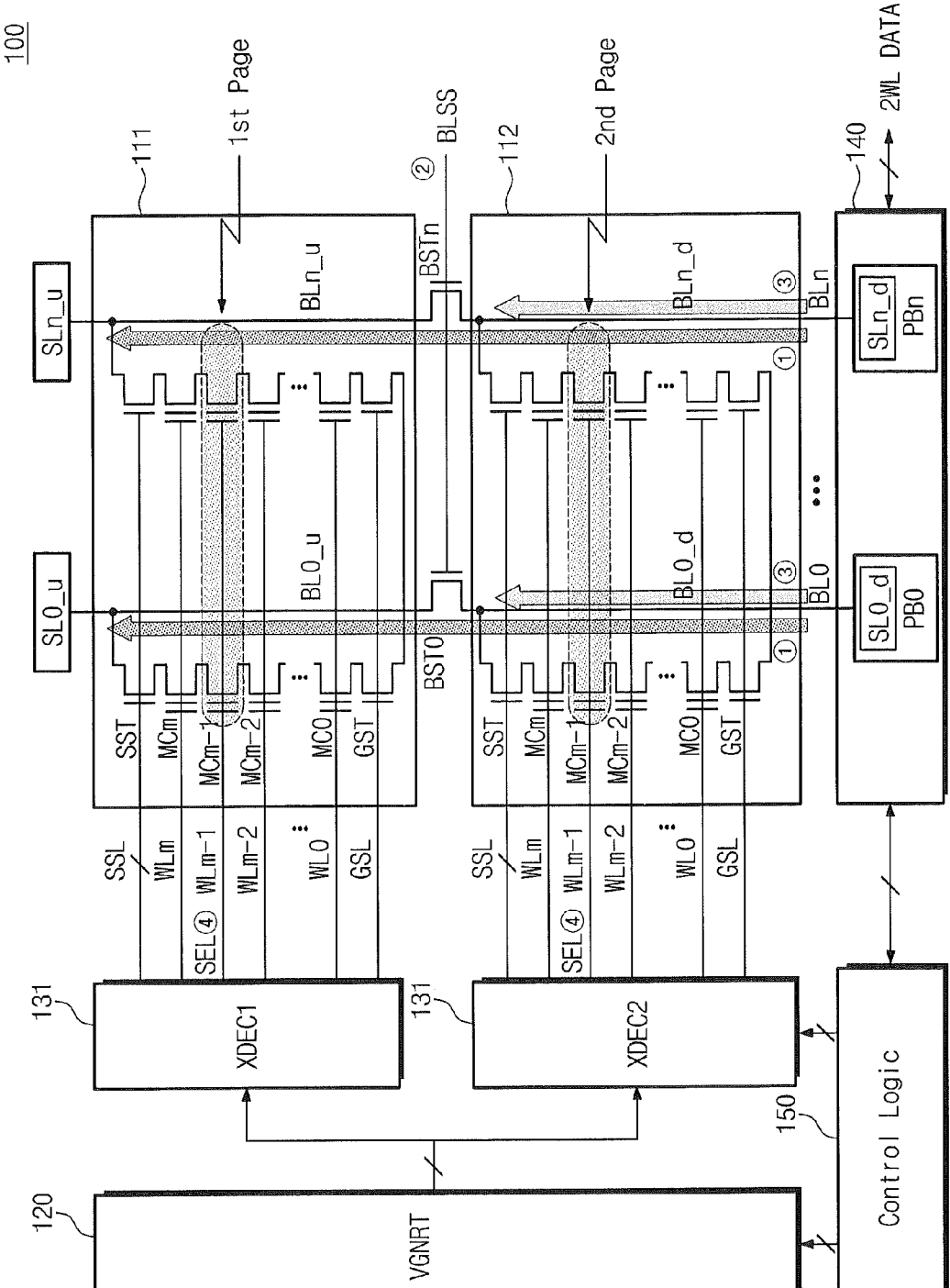
FIG. 2 is a diagram illustrating a program operation of a nonvolatile memory device of FIG. 1.

FIG. 2 is a diagram for describing a program operation of a nonvolatile memory device 100 of FIG. 1. Referring to FIGS. 1 and 2, voltages corresponding to first page data of two word line data provided from an external device may be applied to bit lines BL0 to BLn (①). Afterwards, bit line sharing transistors BST0 to BSTn may be turned off (②). Then, lower bit lines BL0_d to BLn_d may be discharged, and voltages corresponding to second page data of the two word line data may be applied to the bit lines BL0 to BLn (③). Thus, lower bit lines BL0_d to BLn_d may be set up. Afterwards, a program voltage may be applied to word lines selected by address decoders 131 and 132, respectively (④).

Thus, the first page data and the second page data may be simultaneously programmed.

Figure 3:
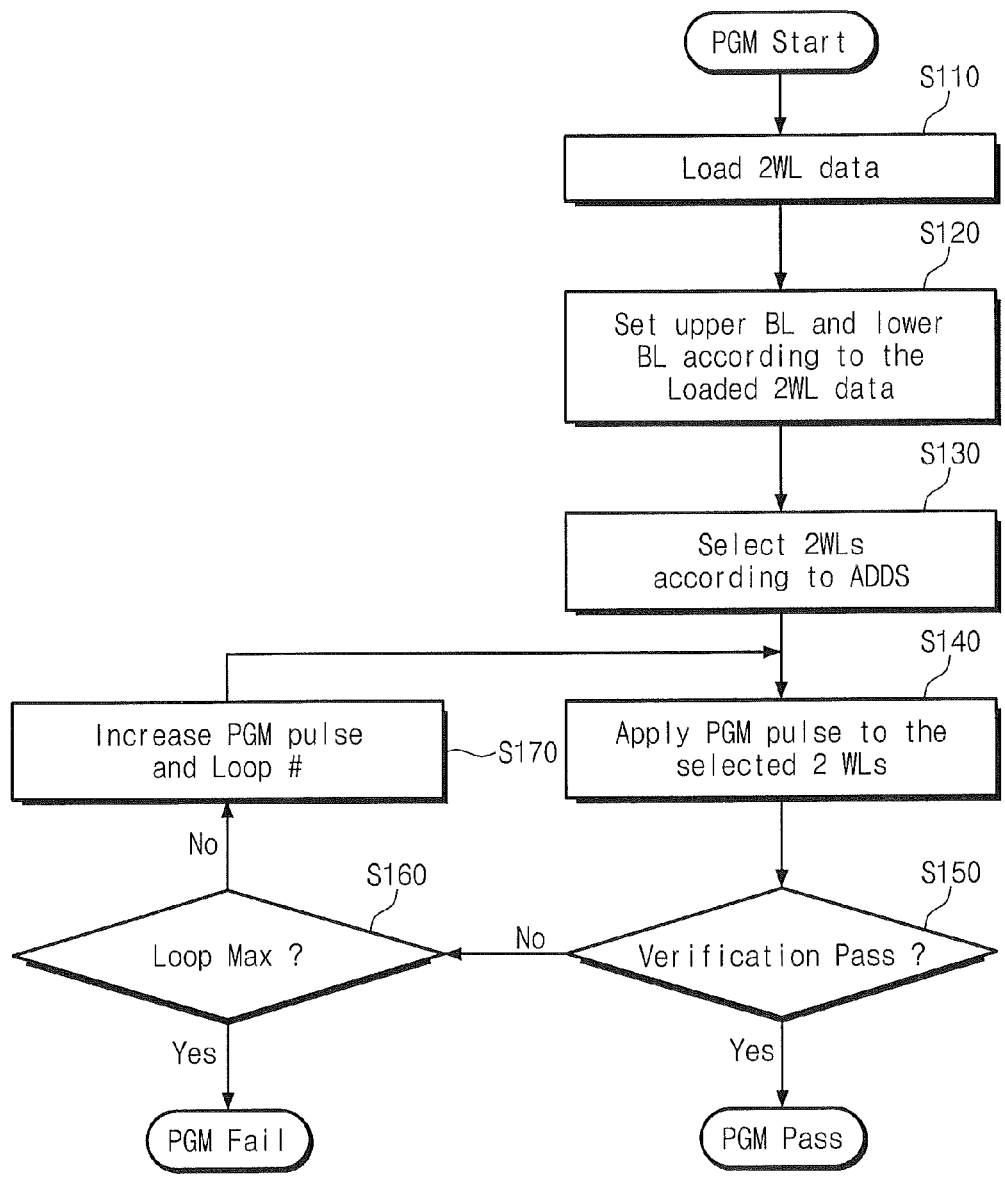
FIG. 3 is a flow chart schematically illustrating a program method of a nonvolatile memory device 100 of FIG. 1.

FIG. 3 is a flow chart schematically illustrating a program method of a nonvolatile memory device 100 of FIG. 1. Referring to FIGS. 1 to 3, in operation S110, two word line data to be programmed may be loaded on page buffers PB0 to PBn through an input/output circuit 140. A voltage generating circuit 120 may generate driving voltages (e.g., a program voltage, a pass voltage, a high voltage, a well voltage, a verification read voltage, etc.) needed to perform a program operation under the control of control logic 150.

Upper bit lines BL0_u to BLn_u and lower bit lines BL0_d to BLn_d may be set up according to data loaded on the page buffers PB0 to PBn. As illustrated in FIG. 1, in operation S120, the upper bit lines BL0_u to BLn_d may be set up according to data corresponding to a word line to be written with a first page by turning on bit line sharing transistors BST0 to BSTn, and then the lower bit lines BL0_d to BLn_d may be set up according to data corresponding to a word line to be written with a second page by turning off the bit line sharing transistors BST0 to BSTn.

In operation S130, address decoders 131 and 132 may select two word lines respectively corresponding to the first and second pages to be programmed based on an address. For ease of description, an example where the address decoders 131 and 132 select word lines WLm-1 placed at the same location may be illustrated in FIG. 1. However, the address decoders 131 and 132 can select word lines placed at different locations.

A program pulse corresponding to a program voltage may be applied to the selected word lines WLm-1, and a pass voltage may be applied to unselected word lines WL0 to WLm-2 and WLm. A program loop may be divided into a first program operation based on the upper bit lines BL0_u to BLn_u set up and a second program operation based on the lower bit lines BL0_d to BLn_d set up. The first and second program operations may be performed at the same time.

Afterwards, a program verification operation may be executed. Here, the program verification operation may be similar to the above-described read operation, and a description thereof is thus omitted. In operation S150, whether the program verification operation is passed may be determined. If so, the program operation may be completed. If not, the method may proceed to operation S160, in which whether a current program loop reaches a maximum program loop is determined. If the current program loop is determined to reach the maximum program loop, the program operation may be managed as program fail. If the current program loop does not reach the maximum program loop, the method may proceed to operation S170, in which a program pulse corresponding to the program voltage is increased by a predetermined voltage. Afterwards, the method may proceed to operation S140.

With the program method of the nonvolatile memory device 100 of the inventive concepts, a program pulse may be simultaneously applied to two word lines every program loop.

Figure 4:
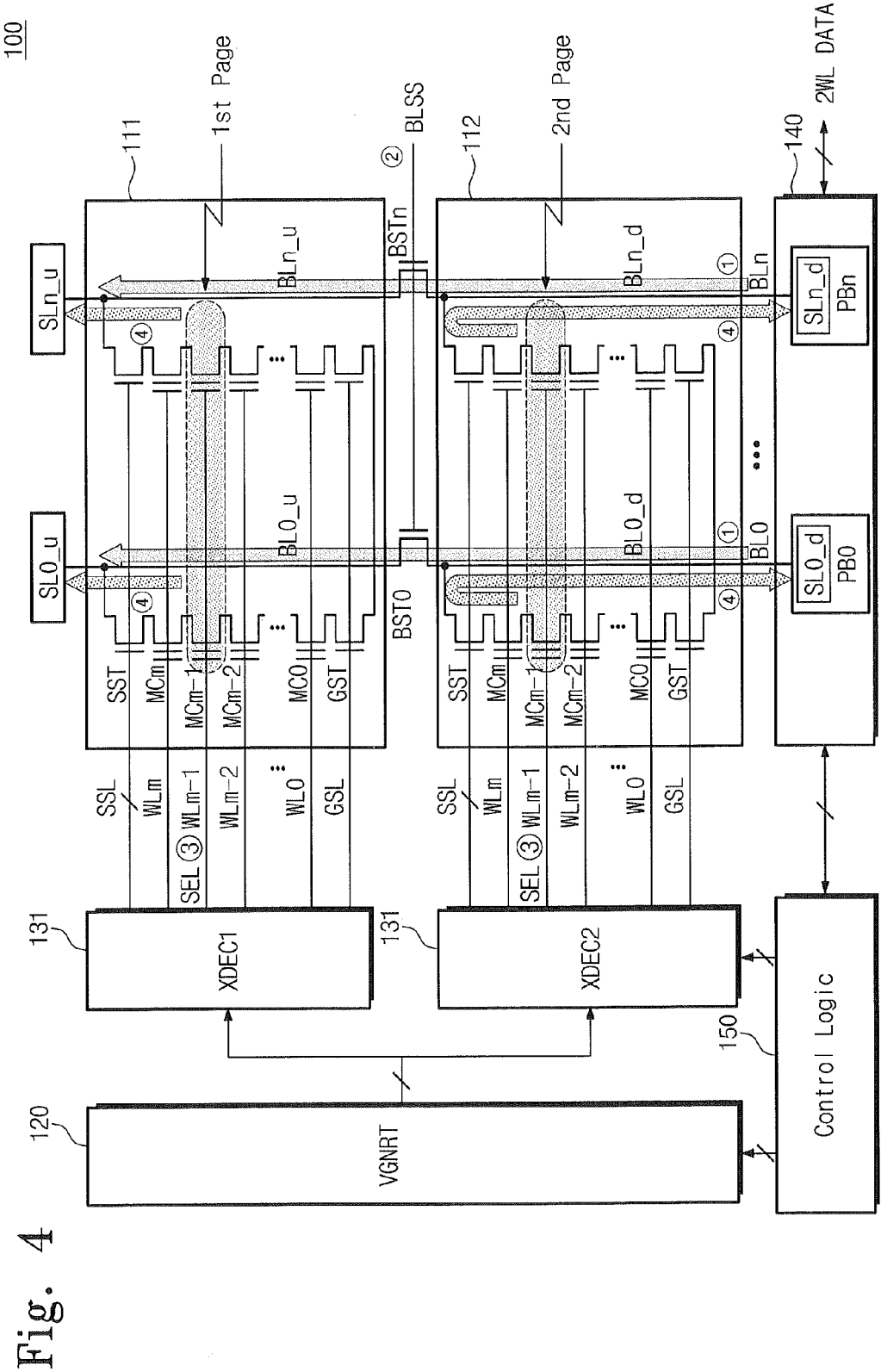
FIG. 4 is a diagram illustrating a read operation of a nonvolatile memory device of FIG. 1.

FIG. 4 is a diagram for describing a read operation of a nonvolatile memory device 100 of FIG. 1. Referring to FIGS. 1 and 4, at a read operation, pre-charge voltages may be applied to bit lines BL0 to BLn (①). Then, bit line sharing transistors BST0 to BSTn may be turned off (②). Thus, upper bit lines BL0_$u$ to BLn_u and lower bit lines BL0_$d$ to BLn_d may be pre-charged. Then, a read pulse may be applied to selected word lines WLm-1 (refer to FIG. 1) at the same time (③). First page data may be stored at upper sense latches SL0_$u$ to SLn_u by sensing voltage of the upper bit lines BL0_$u$ to BLn_u, and second page data may be stored at lower sense latches SL0_$d$ to SLn_d by sensing voltage of the lower bit lines BL0_$d$ to BLn_d (④).

With the read operation of the inventive concepts, first page data and second page data may be read out at the same time.

Figure 5:
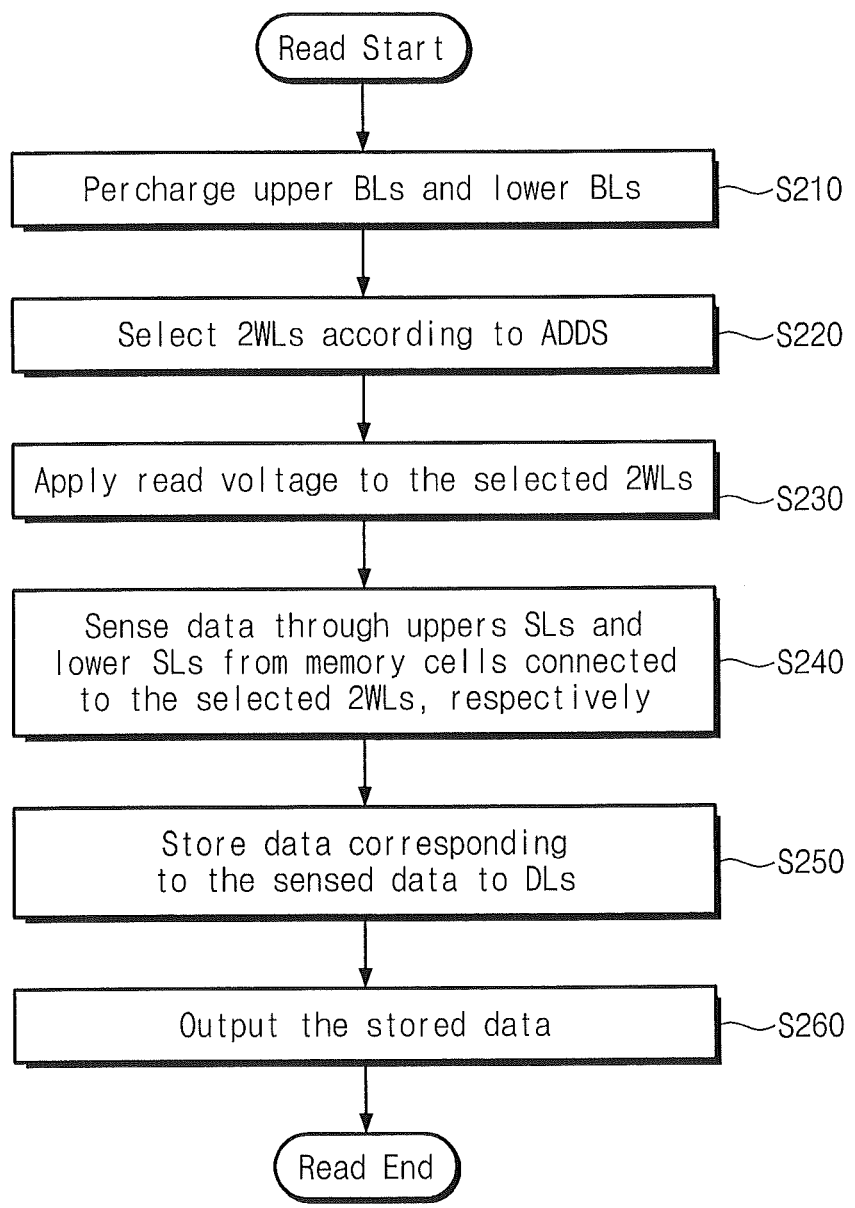
FIG. 5 is a flow chart schematically illustrating a read method of a nonvolatile memory device according to an embodiment of the inventive concepts.

FIG. 5 is a flow chart schematically illustrating a read method of a nonvolatile memory device 100 according to an embodiment of the inventive concepts. Below, a read method of a nonvolatile memory device 100 will be more fully described with reference to FIGS. 1, 4, and 5.

In operation S210, page buffers PB0 to PBn may pre-charge upper bit lines BL0_$u$ to BLn_u and lower bit lines BL0_$d$ to BLn_d with bit line sharing transistors BST0 to BSTn being turned on. Afterwards, the bit line sharing transistors BST0 to BSTn may be turned off for a sensing operation. Thus, the upper bit lines BL0_$u$ to BLn_u and the lower bit lines BL0_$d$ to BLn_d may be pre-charged.

In operation S220, address decoders 131 and 132 may select two word lines WLm-1 respectively corresponding to first and second pages to be read based on an address. In operation S230, a read voltage may be applied to the selected word lines. A sensing operation may be divided into a first sensing operation using the upper bit lines BL0_$u$ to BLn_u pre-charged and a second sensing operation using the lower bit lines BL0_$d$ to BLn_d pre-charged. The first and second sensing operations may be performed at the same time. In operation S250, data sensed by upper sense latches SL0_$u$ to SLn_u and lower sense latches SL0_$d$ to SLn_d may be stored at data latches of the page buffers PB0 to PBn. Here, data stored at the data latches may be two word line data. In operation S260, an input/output circuit 140 may output the two word line data read.

With the read method of the nonvolatile memory device 100 of the inventive concepts, data may be simultaneously read from memory cells connected with two word lines.

In FIGS. 1 to 5, there is described an example where each of address decoders 131 and 132 selects a word line at a program or read operation. However, the inventive concepts are not limited thereto. For example, an address decoder can be implemented to select two word lines.

Figure 6:
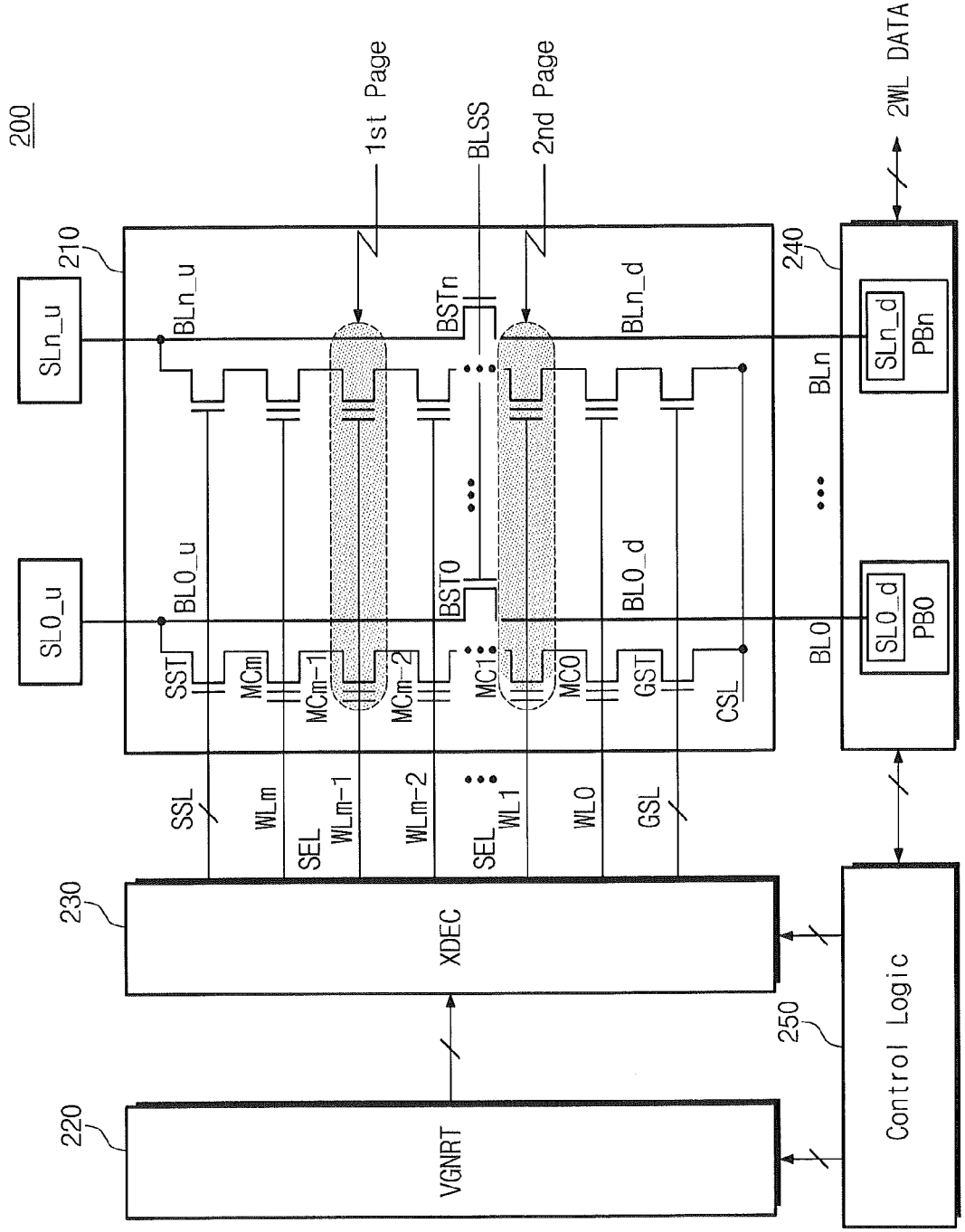
FIG. 6 is a block diagram schematically illustrating a memory device according to another embodiment of the inventive concepts.

FIG. 6 is a block diagram schematically illustrating a memory device 200 according to another embodiment of the inventive concepts. Referring to FIG. 6, a memory device 200 may include a memory cell array 210, a voltage generating circuit 220, an address decoder 230, an input/output circuit 240, and control logic 250.

The memory cell array 210 may include a plurality of memory blocks. In FIG. 6, there is illustrated a memory block. The memory block may include strings respectively connected to bit lines BL0 to BLn (n being an integer of 2 or more). Here, each bit line BLi (i being 0 through n) may be formed of an upper bit line BLi_u, a lower bit line BLi_d, and a bit line sharing transistor BSTi connecting the upper bit line BLi_u and the lower bit line BLi_d in response to a bit line sharing signal BLSS. Here, a string may include at least one string selection transistor SST, memory cells MC0 to MCm (m being an integer of 2 or more), and at least one ground selection transistor GST.

The voltage generating circuit 220 may generate driving voltages (e.g., Vpp, Vers, Vpgm, Vpass, Vr, Vread, etc.) needed to drive the nonvolatile memory device 200. The voltage generating circuit 220 may generate the driving voltages using at least one charge pump (not shown) or by dividing an external high voltage.

The address decoder 230 may select two word lines of word lines WL0 to WLm based on an address input at a program or read operation.

At a program operation, the input/output circuit 240 may temporarily store two word line data 2WL DATA received from an external device to store it at pages $1^{st}$ page and $2^{nd}$ page to be written. At a read operation, the input/output circuit 140 may temporarily read two word line data from pages $1^{st}$ page and $2^{nd}$ page to be read to output it to the external device. Here, each of the pages $1^{st}$ page and $2^{nd}$ page may mean memory cells connected with a word line.

The input/output circuit 240 may include page buffers PB0 to BPn respectively corresponding to the bit lines BL0 to BLn. Each of the page buffers PB0 to BPn may include a plurality of data latches (not shown), upper sense latches SL0_$u$ to SLn_u, and lower sense latches SL0_$d$ to SLn_d.

The control logic 250 may control an overall operation of the nonvolatile memory device 200. The control logic 250 may decode commands and control signals provided from an external memory controller to control the voltage generating circuit 220, the address decoder 230, and the input/output circuit 240.

In example embodiments, the control logic 250 may control the voltage generating circuit 220, the address decoder 230, and the input/output circuit 240 to simultaneously write or read two word line data at or from first and second pages connected with two word lines (e.g., WL1 and WLm-1) at a program or read operation.

In example embodiments, the control logic 250 may generate the bit line sharing signal BLSS to simultaneously write or read two word line data at or from first and second pages.

Figure 7:
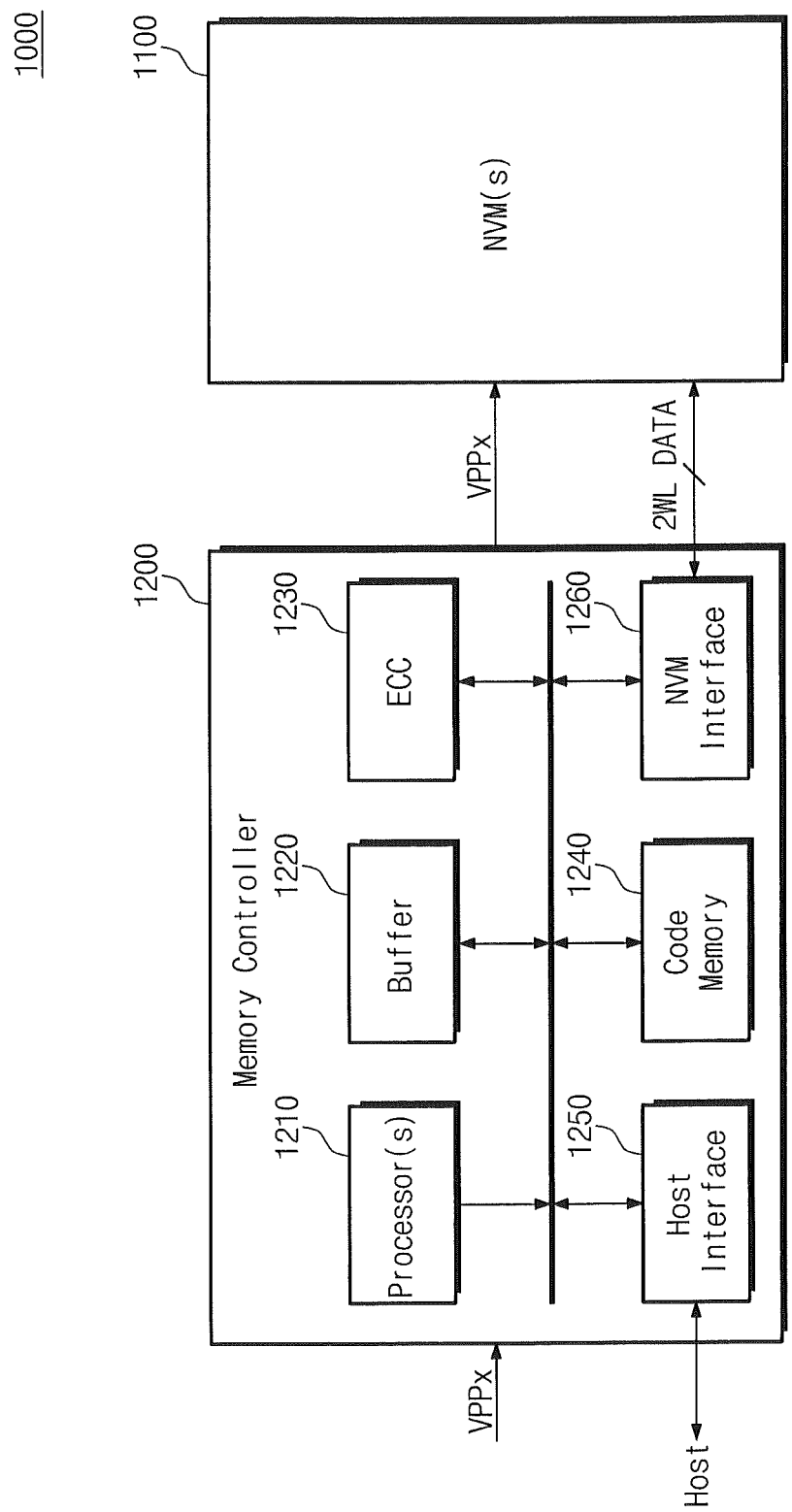
FIG. 7 is a block diagram schematically illustrating a memory system according to the inventive concepts.

FIG. 7 is a block diagram schematically illustrating a memory system according to the inventive concepts. Referring to FIG. 7, a memory system 1000 may include at least one nonvolatile memory device 1100 and a memory controller 1200. The nonvolatile memory device 1100 may be one of nonvolatile memory devices 100 and 200 described with reference to FIGS. 1 and 6. That is, the nonvolatile memory device 1100 may perform a program operation and a read operation by a unit of two word line data.

The memory controller 1200 may be connected to the nonvolatile memory device 1100 through a plurality of channels. The memory controller 1200 may include at least one processor 1210, a buffer memory 1220, an ECC circuit 1230, a code memory 1240, a host interface 1250, and a memory interface 1260.

The memory system 1000 according to an embodiment of the inventive concepts may improve program/read performance of the nonvolatile memory device 1100 by inputting and outputting data by a unit of two word lines.

The inventive concepts are applicable to a solid state drive (SSD).

Figure 8:
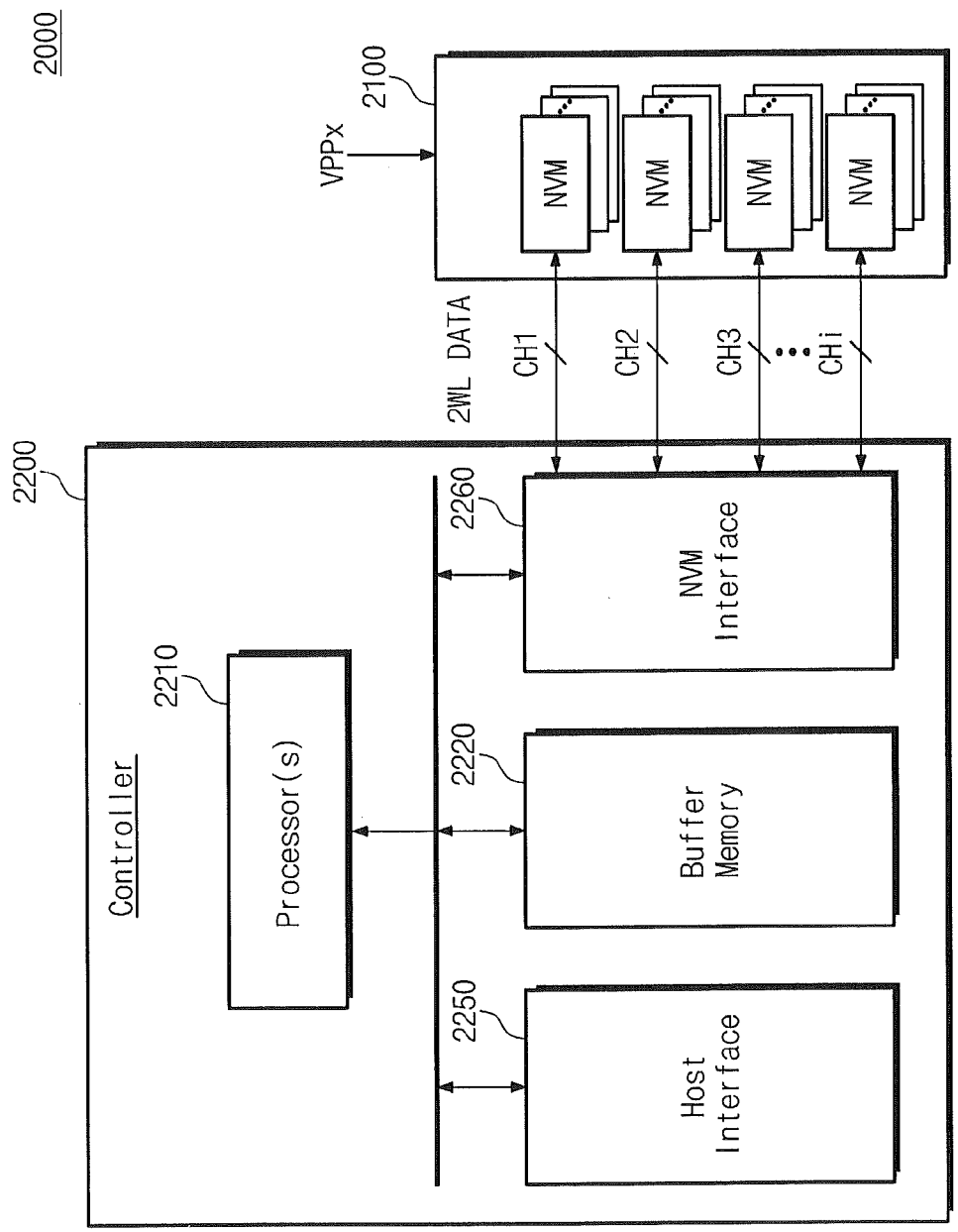
FIG. 8 is a block diagram schematically illustrating a solid state drive according to an embodiment of the inventive concepts.

FIG. 8 is a block diagram schematically illustrating a solid state drive according to an embodiment of the inventive concepts. Referring to FIG. 8, a solid state drive (SSD) 2000 may include a plurality of flash memory devices 2100 and an SSD controller 2200. The flash memory devices 2100 may be configured to be supplied with an external high voltage VPPx.

A method of performing read and program operations by a unit of two word lines described with reference to FIGS. 1 to 6 may be applied to each flash memory device 2100. The SSD controller 2200 may be connected to the flash memory devices 2100 via a plurality of channels CH1 to CHi (i being an integer of 2 or more). The SSD controller 2200 may include at least one processor 2210, a buffer memory 2220, a host interface 2250, and a flash interface 2260.

As the SSD 2000 of the inventive concepts is driven by a unit of two word lines, it may be advantageous to store mass data.

The inventive concepts is applicable to an embedded multimedia controller (MMC) (hereinafter, referred to as eMMC).

Figure 9:
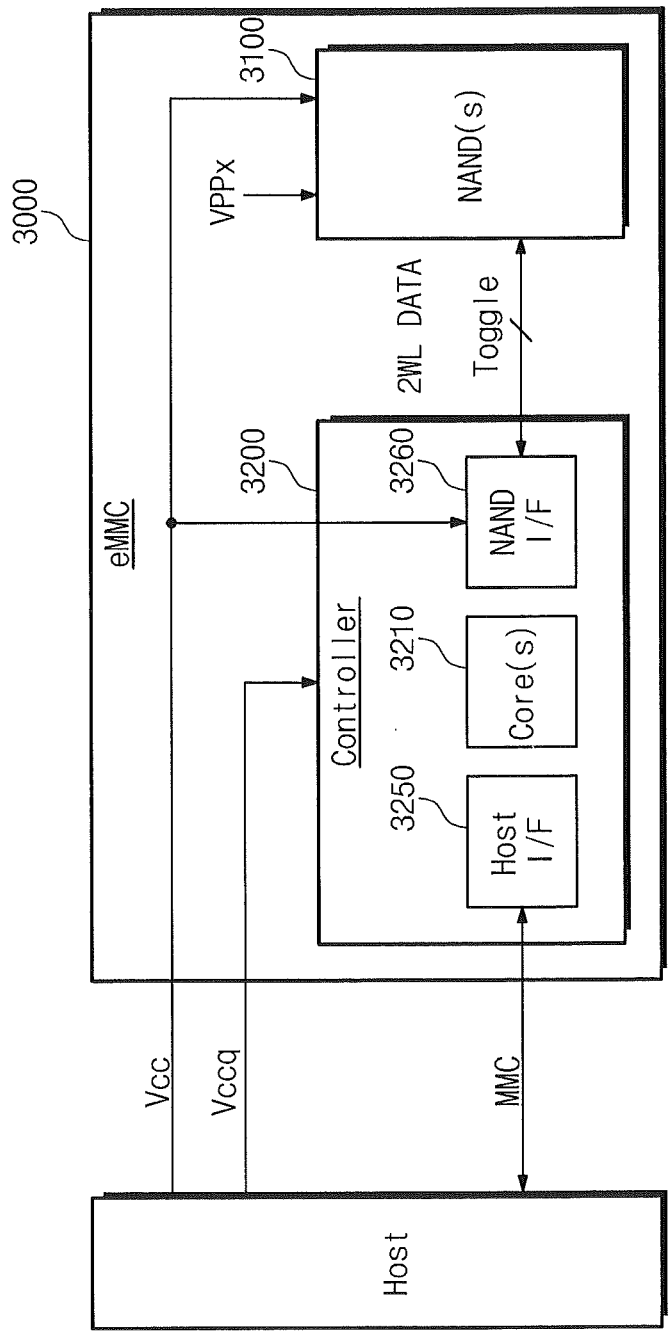
FIG. 9 is a block diagram schematically illustrating an eMMC according to an embodiment of the inventive concepts.

FIG. 9 is a block diagram schematically illustrating an eMMC according to an embodiment of the inventive concepts. Referring to FIG. 9, an eMMC 3000 may include at least one NAND flash memory device 3100 and controller 3200. The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.). A method of performing read and program operations by a unit of two word lines described with reference to FIGS. 1 to 6 may be applied to each NAND flash memory chip.

The controller 3200 may be connected with the flash memory device 3100 through a plurality of channels. The controller 3200 may include at least one controller core 3210, a host interface 3250, and a NAND interface 3260. The controller core 3210 may control an overall operation of the eMMC 3000. The host interface 3250 may be configured to perform an interface between the controller 3200 and a host. The NAND interface 3260 may be configured to provide an interface between the NAND flash memory device 3100 and the controller 3200. In example embodiments, the host interface 3250 may be a parallel interface (e.g., an MMC interface). In other example embodiments, the host interface 3250 of the eMMC 3000 may be a serial interface (e.g., UHS-II, UFS, etc.).

The eMMC 3000 may receive power supply voltages Vcc and Vccq from the host. Herein, the power supply voltage Vcc (about 3.3V) may be supplied to the NAND flash memory device 3100 and the NAND interface 3260, and the power supply voltage Vccq (about 1.8V/3.3V) may be supplied to the controller 3200.

The eMMC 3000 according to an embodiment of the inventive concepts is applicable to small-sized and low-power mobile products (e.g., Galaxy S series, Galaxy note series, iPhone, iPad, Nexus, etc.).

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A program method of a memory device, comprising:
    loading first word line data to be stored in first memory cells connected to a first word line and second word line data to be stored in second memory cells connected to a second word line;
    setting up upper bit lines according to the first word line data;
    turning off bit line sharing transistors after the upper bit lines are set up;
    setting up lower bit lines according to the second word line data;
    performing a first program operation on the first memory cells using the upper bit lines;
    performing a second program operation on the second memory cells using the lower bit line;
    performing a first program verification operation by a first read operation after the first program operation is executed; and
    performing a second program verification operation by a second read operation after the second program operation is executed,
    wherein the bit line sharing transistors electrically connect the upper bit lines and the lower bit lines in response to a bit line sharing signal, and
    wherein the first and second read operations are both performed by a page data unit.

2. The program method of claim 1, wherein the performing a first program operation on the first memory cells using the upper bit lines comprises:
    applying a program pulse to the first word line.

3. The program method of claim 2, wherein the performing a second program operation on the second memory cells using the lower bit lines comprises:
    applying the program pulse to the second word line.

4. The program method of claim 3, wherein the program pulse is simultaneously applied to the first and second word lines in the first and second program operations.

5. The program method of claim 3, wherein a pass voltage is applied to remaining word lines other than the first and second word lines in the first and second program operations.

6. The program method of claim 2, wherein the first and second program operations are executed at a same time.

7. The program method of claim 1, wherein a first memory block including the first memory cells is separated from a second memory block including the second memory cells.

8. The program method of claim 1, further comprising the following when the program verification operation is failed:
    increasing a program pulse by a predetermined value;
    again setting up the upper and lower bit lines; and
    again performing the first and second program operations.

9. The program method of claim 1, wherein the bit line sharing transistors are high voltage transistors.

10. A program method of a memory device, comprising:
    coupling respective bit lines of first and second portions of the memory device together;
    applying first data to be programmed into the first portion of the memory device to the respective bit lines of the first and second portions of the memory device that are coupled together;
    decoupling the respective bit lines of first and second portions of the memory device from one another;
    applying second data to be programmed into the second portion of the memory device to the respective bit lines of the second portion of the memory device that are decoupled from the bit lines of the first portion; and
    simultaneously selecting a word line of the first portion of the memory device and a word line of the second portion of the memory device so as to simultaneously program the first data into the first portion of the memory device and the second data into the second portion of the memory device.

11. The program method of claim 10 further comprising the following between the decoupling and the applying second data;

discharging the bit lines of the second portion of the memory device that are decoupled from the bit lines of the first portion.

12. The program method of claim 11 wherein the coupling and the decoupling are performed by turning on and turning off, respectively, a plurality of bit line sharing transistors, a respective one of which electrically connects a respective one of the bit lines of the first and second portions of the memory device.

13. The program method of claim 10 wherein the coupling and the decoupling are performed by turning on and turning off, respectively, a plurality of bit line sharing transistors, a respective one of which electrically connects a respective one of the bit lines of the first and second portions of the memory device.

* * * * *